United States Patent
Bartley et al.

(10) Patent No.: US 7,055,119 B2
(45) Date of Patent: May 30, 2006

(54) CUSTOMIZED MESH PLANE, METHOD AND COMPUTER PROGRAM PRODUCT FOR CREATING CUSTOMIZED MESH PLANES WITHIN ELECTRONIC PACKAGES

(75) Inventors: Gerald Keith Bartley, Rochester, MN (US); Darryl John Becker, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 10/632,183

(22) Filed: Jul. 31, 2003

(65) Prior Publication Data
US 2005/0028130 A1 Feb. 3, 2005

(51) Int. Cl.
*G06F 17/50* (2006.01)
(52) U.S. Cl. ............................................. 716/8; 716/11
(58) Field of Classification Search ................. 716/6–9, 716/11
See application file for complete search history.

(56) References Cited

U.S. PATENT DOCUMENTS

| | | | |
|---|---|---|---|
| 6,480,989 B1 * | 11/2002 | Chan et al. ..................... | 716/8 |
| 2002/0117751 A1 * | 8/2002 | Crane et al. ................. | 257/734 |
| 2003/0015787 A1 * | 1/2003 | Geissinger et al. ......... | 257/692 |
| 2004/0188138 A1 * | 9/2004 | Baras et al. ................ | 174/261 |

* cited by examiner

*Primary Examiner*—Matthew Smith
*Assistant Examiner*—Binh Tat
(74) *Attorney, Agent, or Firm*—Joan Pennington

(57) ABSTRACT

A method, apparatus, and computer program product are provided for creating customized mesh planes in electronic packages. Electronic package physical design data is received and signal traces in each adjacent plane to a mesh plane are compared with the mesh layout. Signal traces adjacent to mesh holes are identified. One or more fill methods are selected to modify the mesh layout to replace selected mesh holes with added mesh structure aligned with the identified signal traces.

12 Claims, 12 Drawing Sheets

300

CUSTOMIZED MESH PLANE, METHOD AND COMPUTER PROGRAM PRODUCT FOR CREATING CUSTOMIZED MESH PLANES WITHIN ELECTRONIC PACKAGES

FIELD OF THE INVENTION

The present invention relates generally to the data processing field, and more particularly, relates to a customized mesh plane, method, and computer program product for creating customized mesh planes within electronic packages.

DESCRIPTION OF THE RELATED ART

Electronic packages typically include multiple layers or planes including multiple signal, voltage and ground planes. Some electronic packages utilize a mesh structure to construct what appears to be voltage or ground plane. The mesh structure is needed to allow enough non-metal area to insure proper joining or lamination of the plane structures.

When designing an electronic package that must utilize a mesh plane, such as, for a power plane or a ground plane, many times the adjacent signal traces may line up with holes in the mesh rather than on the mesh lines. In some cases the signal lines may not line up on the mesh lines due to its relative placement in the escape from the chip, or due to the signal line is escaping diagonally across the mesh openings.

A signal line disposed above or below mesh holes in the mesh plane has a different characteristic impedance than a signal line disposed directly above or below a mesh trace. Signal crosstalk also may occur to a greater extent through the mesh holes to signal traces disposed above or below the mesh holes.

A need exists for a mechanism for customizing the mesh plane for optimizing signal integrity and to meet all manufacturing limitations for an electronic package.

SUMMARY OF THE INVENTION

A principal object of the present invention is to provide a customized mesh plane, method, and computer program product for creating customized mesh planes in electronic packages. Other important objects of the present invention are to provide such method, apparatus, and computer program product for creating customized mesh planes in electronic packages substantially without negative effect and that overcome many of the disadvantages of prior art arrangements.

In brief, a customized mesh plane, method, and computer program product are provided for creating customized mesh planes in electronic packages. Electronic package physical design data is received and signal traces in each adjacent plane to a mesh plane are compared with the mesh layout. Signal traces adjacent to mesh holes are identified. A fill method is selected to modify the mesh layout to replace selected mesh holes with added mesh structure aligned with the identified signal traces.

In accordance with features of the invention, a plurality of predefined fill methods are provided. One of the multiple, predefined fill methods is selected to modify the mesh layout using predefined design rules or is selected by a user. The added mesh structure aligned with the identified signal traces that is provided by one or a combination of the predefined fill methods includes one or a selected combination of a crosshair structure, a single line, a signal mirror, a mesh shifted structure, a complete fill structure, a metal fill structure, and a corner fill structure.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1A:
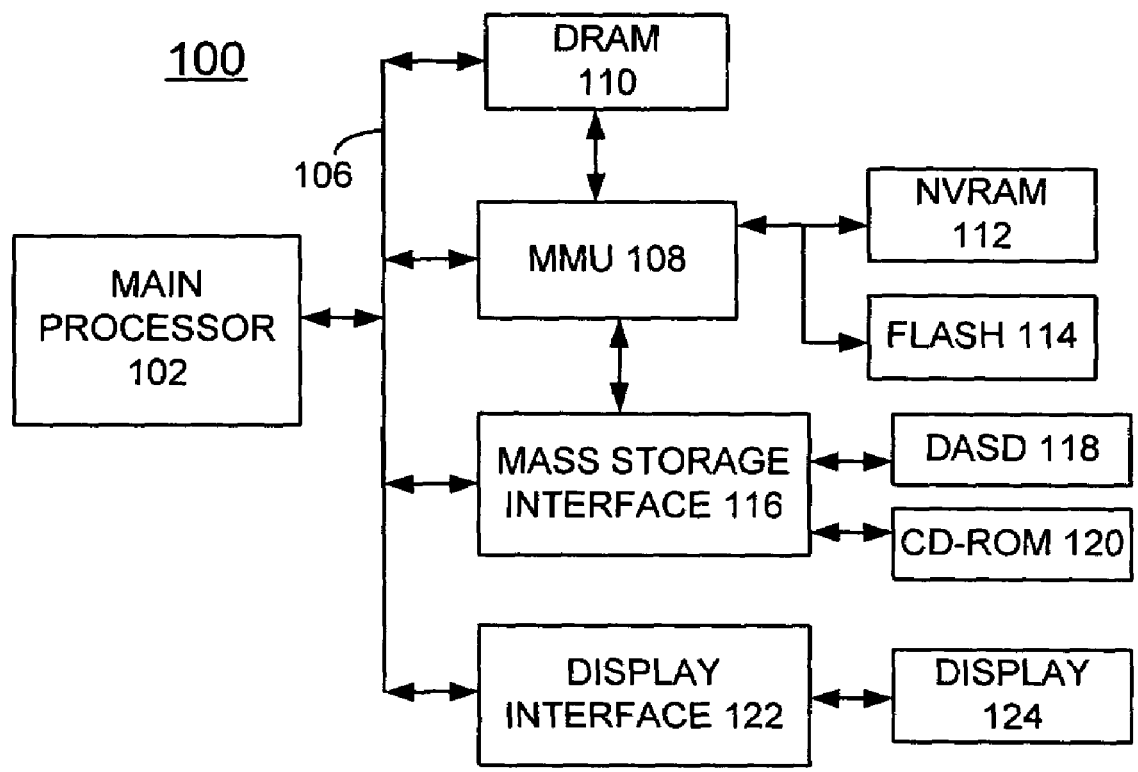
FIGS. 1A and 1B are block diagram representations illustrating a computer system and operating system for implementing methods for creating customized mesh planes within electronic packages in accordance with the preferred embodiment.
Figure 1B:
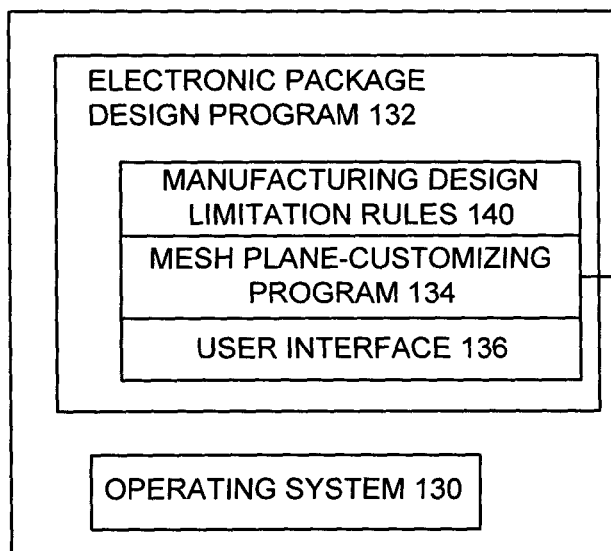

Referring now to the drawings, in FIGS. 1A and 1B there is shown a computer system generally designated by the reference character 100 for implementing methods for creating customized mesh planes within electronic packages in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 1B, computer system 100 includes an operating system 130, an electronic package design program 132, a mesh plane-customizing program 134 of the preferred embodiment, and a user interface 136. A library including a plurality of fill methods 138, #1-N and manufacturing design limitation rules 140 are stored in accordance with the mesh plane customizing methods of the preferred embodiment. Fill methods 140 #1-N include, for example, a crosshair fill method, a single line fill method, a signal mirror fill method, a mesh shifting fill method, a complete fill method, and a corner fill method that are used individually or in various combinations for creating customized mesh planes in accordance with the preferred embodiment.

Various commercially available computers can be used for computer system 100, for example, an IBM personal computer. CPU 102 is suitably programmed by the mesh plane-customizing program 134 to execute the flowchart of FIG. 2 for creating customized mesh planes within electronic packages in accordance with the preferred embodiment.

In accordance with features of the preferred embodiment, a method is provided that receives a nearly completed physical package design, reads the design data and calculates instructions to fill in mesh holes at instances which are adjacent to signal traces. Mesh structure or traces added to the mesh planes to fill the mesh holes include of a variety of different shapes depending upon manufacturing design limitation rules 140 that define how much metal may be added to the mesh plane and what manufacturing shapes are acceptable. It should be understood that this method could be manually implemented by visually checking the design system, while the mesh plane-customizing program 134 of the preferred embodiment advantageously is used to automate the mesh plane customizing process.

In accordance with features of the preferred embodiment, a customized mesh plane created by the mesh plane customizing method provides improved signal integrity resulting from a more consistent characteristic impedance and also provides improved signal isolation than conventional mesh plane arrangements. The automated method for customizing the mesh plane of the preferred embodiment allows a designer to rapidly construct an electronic package design including customized mesh planes that meets all of the manufacturing limitations while optimizing for signal integrity.

Figure 2:
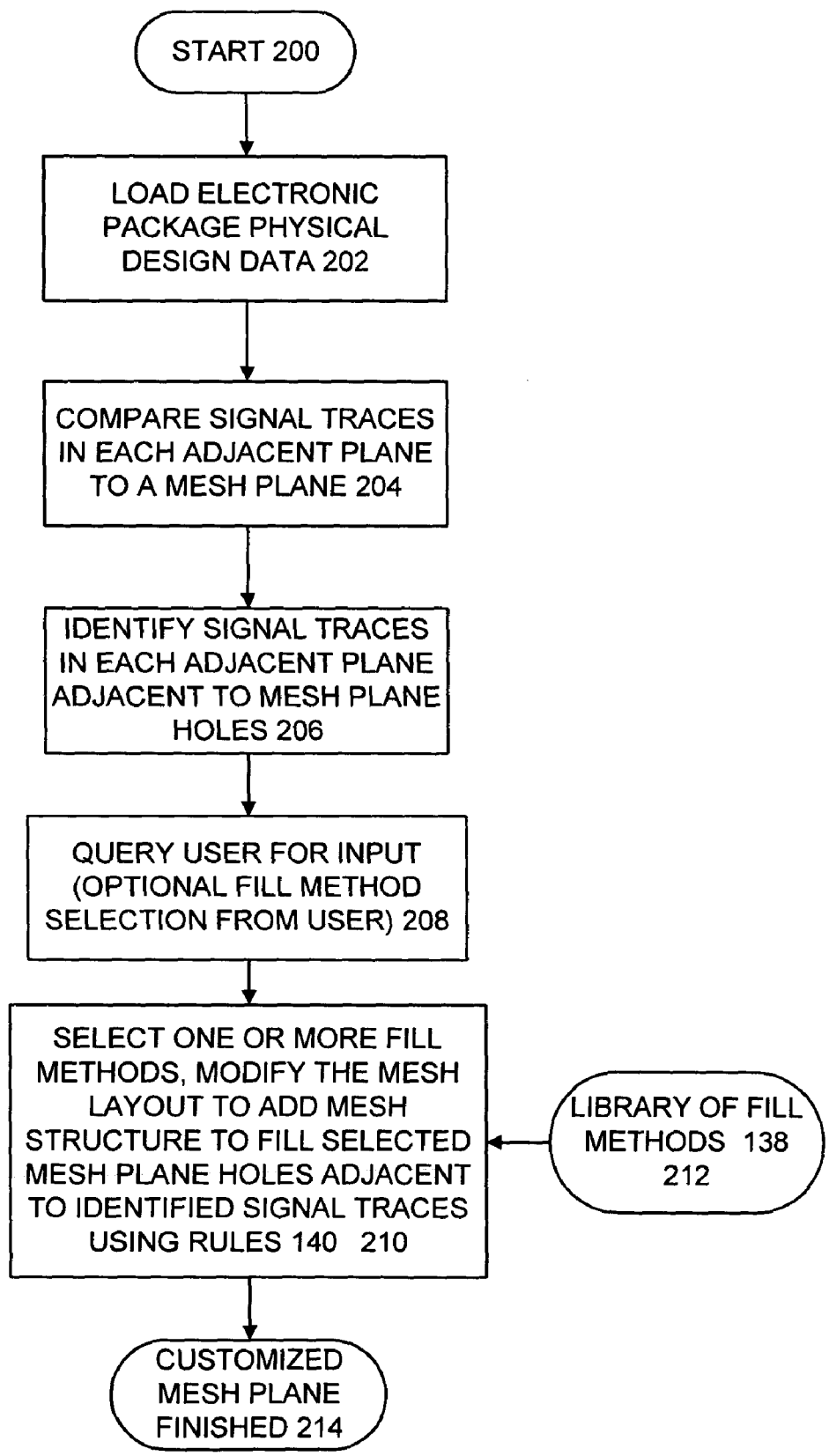
FIG. 2 is a flow chart illustrating exemplary sequential steps for creating a customized mesh plane in accordance with the preferred embodiment.

Referring to FIG. 2, there are shown exemplary steps performed by the computer system 100 for implementing methods for creating customized mesh planes within electronic packages in accordance with the preferred embodiment starting at a block 200. Electronic package physical design data is loaded as indicated in a block 202. Signal traces in each adjacent plane to a mesh plane are compared to the mesh plane layout as indicated in a block 204. Signal traces in each adjacent plane adjacent to mesh holes are identified as indicated in a block 206. A user optionally is queried for input, such as to query the user for one or more fill method selections, as indicated in a block 208. As indicated in a block 210, one or more fill methods are selected from a library of fill methods 138 at block 212, and the mesh layout is modified using the selected fill method or methods to add mesh structure to fill selected mesh plane holes adjacent to identified signal traces. A customized mesh plane is created as indicated in a block 214.

Figure 3:
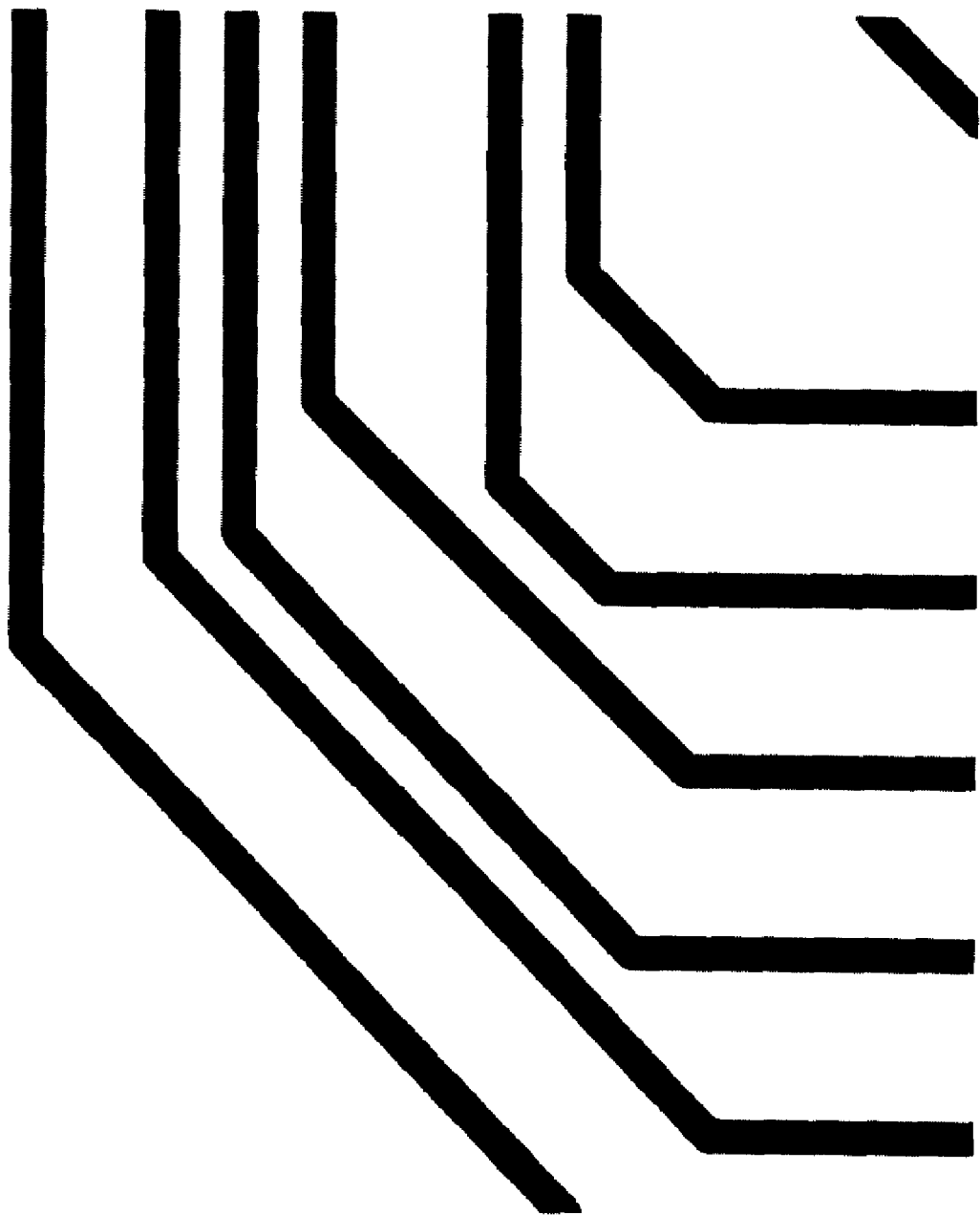
FIG. 3 is a diagram illustrating an exemplary signal plane in an electronic package.
Figure 4:
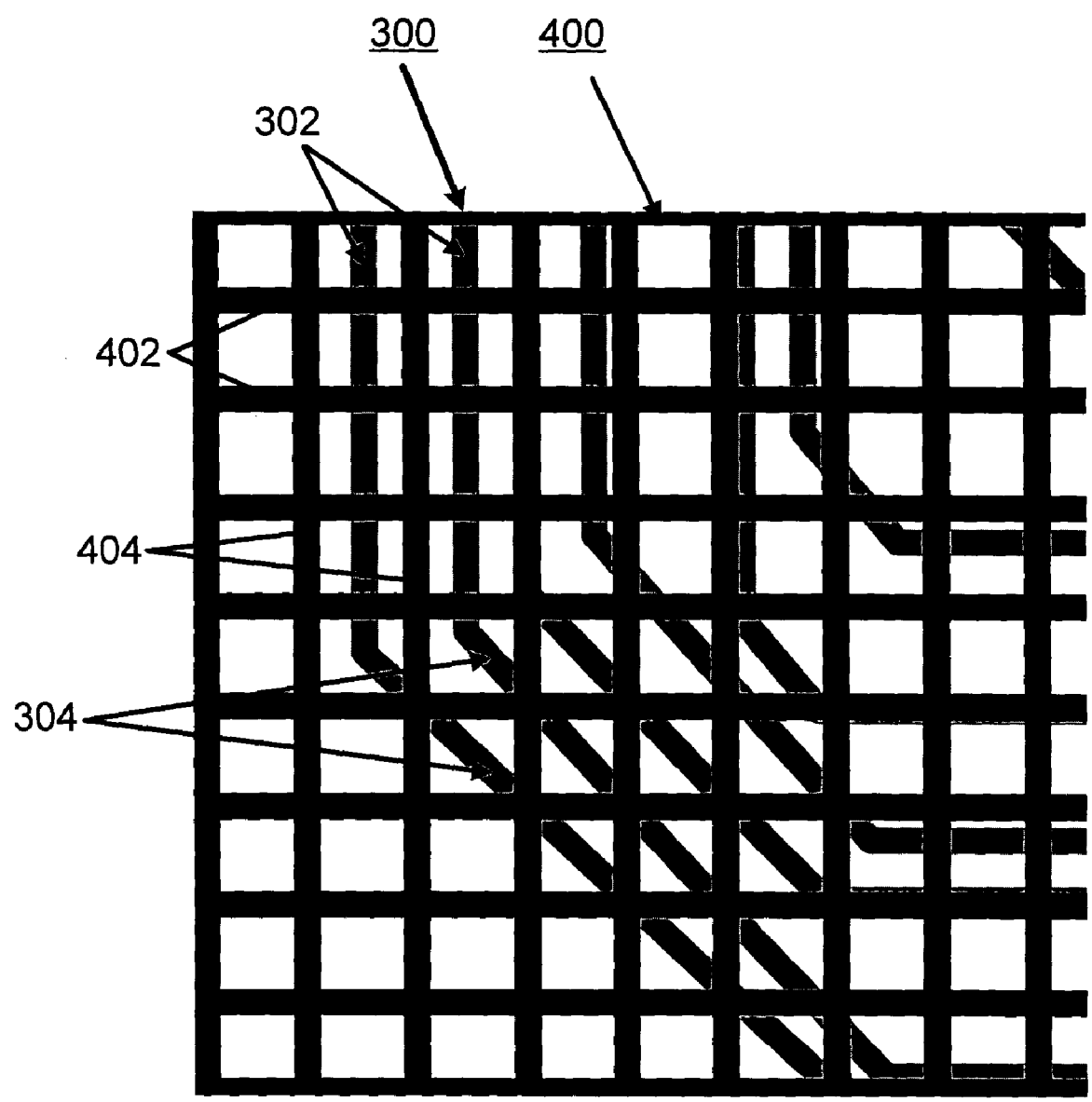
FIG. 4 is a diagram illustrating the exemplary signal plane of FIG. 3 together with an initial mesh plane in the electronic package.

Referring now to FIGS. 3 and 4, in FIG. 3 an exemplary signal plane in an electronic package is shown and generally designated by reference character 300. FIG. 4 illustrates the exemplary signal plane 300 together with an exemplary adjacent mesh plane generally designated by reference character 400. Mesh plane 400 illustrates a typical grid mesh plane defined by a plurality of uniformly spaced apart horizontal mesh traces 402 and a plurality of uniformly spaced apart vertical mesh traces 404.

As shown in FIG. 4 signal plane 300 includes a pair of vertically extending signal traces generally designated by reference character 302 and a pair of diagonally extending signal traces generally designated by reference character 304 that are disposed above or below mesh holes in the mesh plane 400.

FIGS. 5, 6, 7, 8, 9, 10, and 11 illustrate alternative customized mesh planes created in accordance the preferred embodiment using a single or a combination of fill methods 140 #1-N for optimizing signal integrity and signal isolation.

Figure 5:
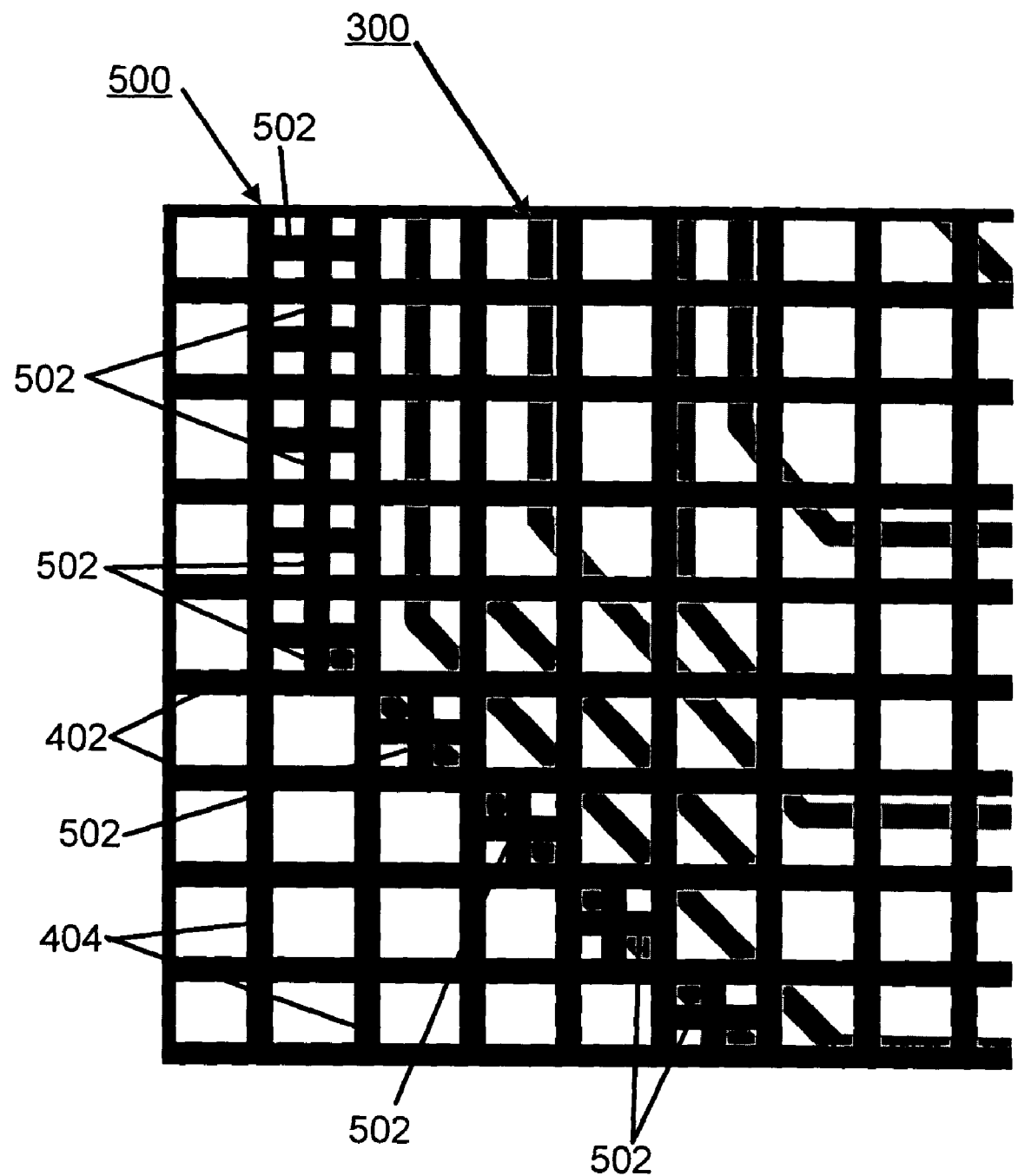
FIGS. 5, 6, 7, 8, 9, 10, and 11 illustrate the exemplary signal plane of FIG. 3 with alternative customized mesh planes created in accordance with fill methods of the preferred embodiment.

Referring now to FIG. 5, there is shown an exemplary customized mesh plane generally designated by reference character 500 in accordance a crosshair fill method of the preferred embodiment. Customized mesh plane 500 includes a crosshair structure 502 added to the mesh plane 400 of FIG. 4 filling selected mesh plane holes adjacent to identified signal traces 302 and 304.

Figure 6:
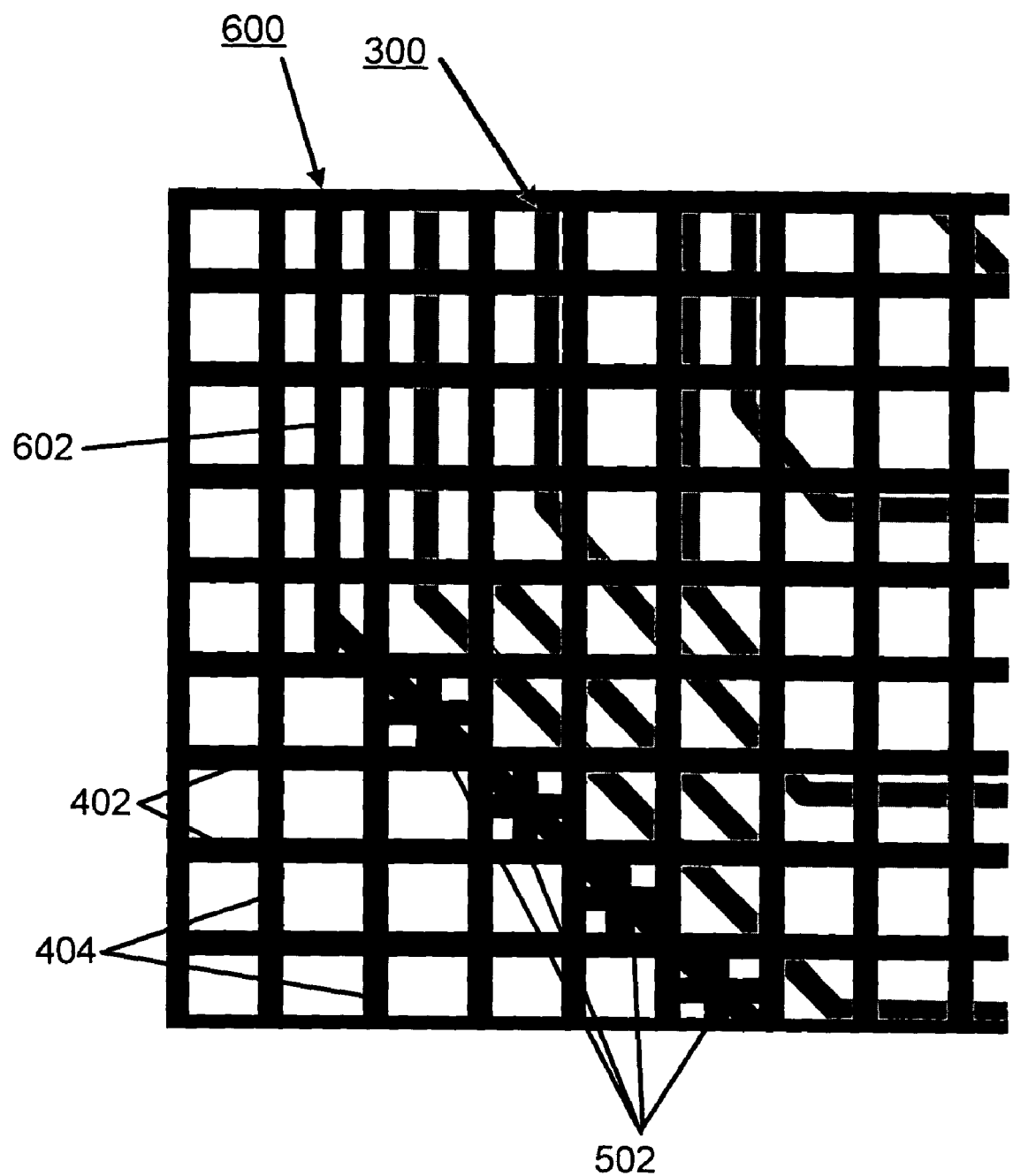

Referring now to FIG. 6, there is shown an exemplary customized mesh plane generally designated by reference character 600 in accordance a single line fill method and the crosshair fill method of the preferred embodiment. Customized mesh plane 600 includes a single line structure 602 filling selected mesh plane holes adjacent to one identified signal trace 302 and the crosshair structure 502 added to the mesh plane 400 of FIG. 4 filling selected mesh plane holes adjacent to one identified signal trace 304.

Figure 7:
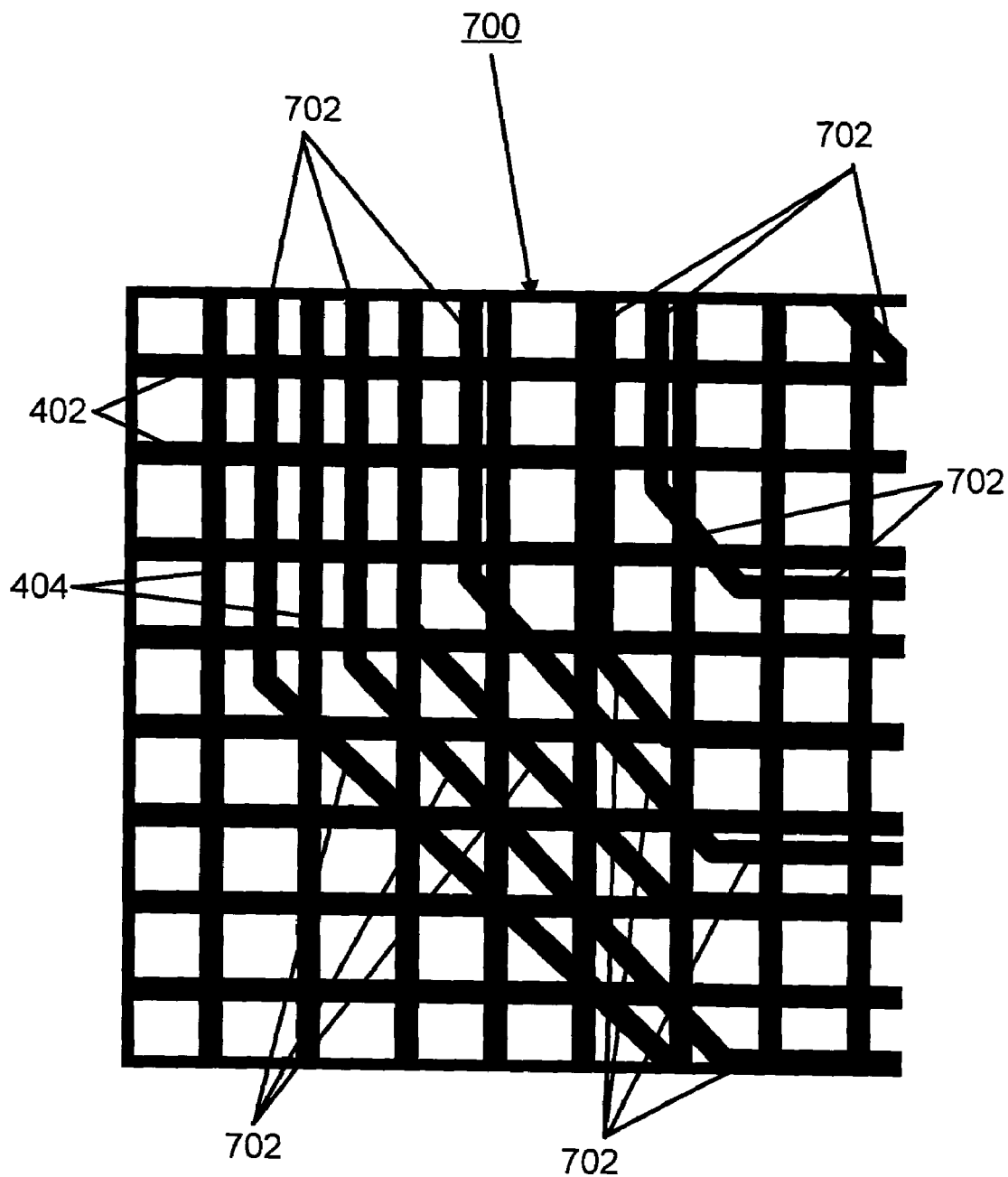

Referring now to FIG. 7, there is shown an exemplary customized mesh plane generally designated by reference character 700 in accordance a signal mirror method of the preferred embodiment. Customized mesh plane 700 includes a signal mirror structure 702 added to the mesh plane 400 of FIG. 4 that provides a substantially exact mirror of the signal plane 300. The signal plane 300 not shown in FIG. 7 is generally aligned with the illustrated signal mirror structure 702.

Figure 8:
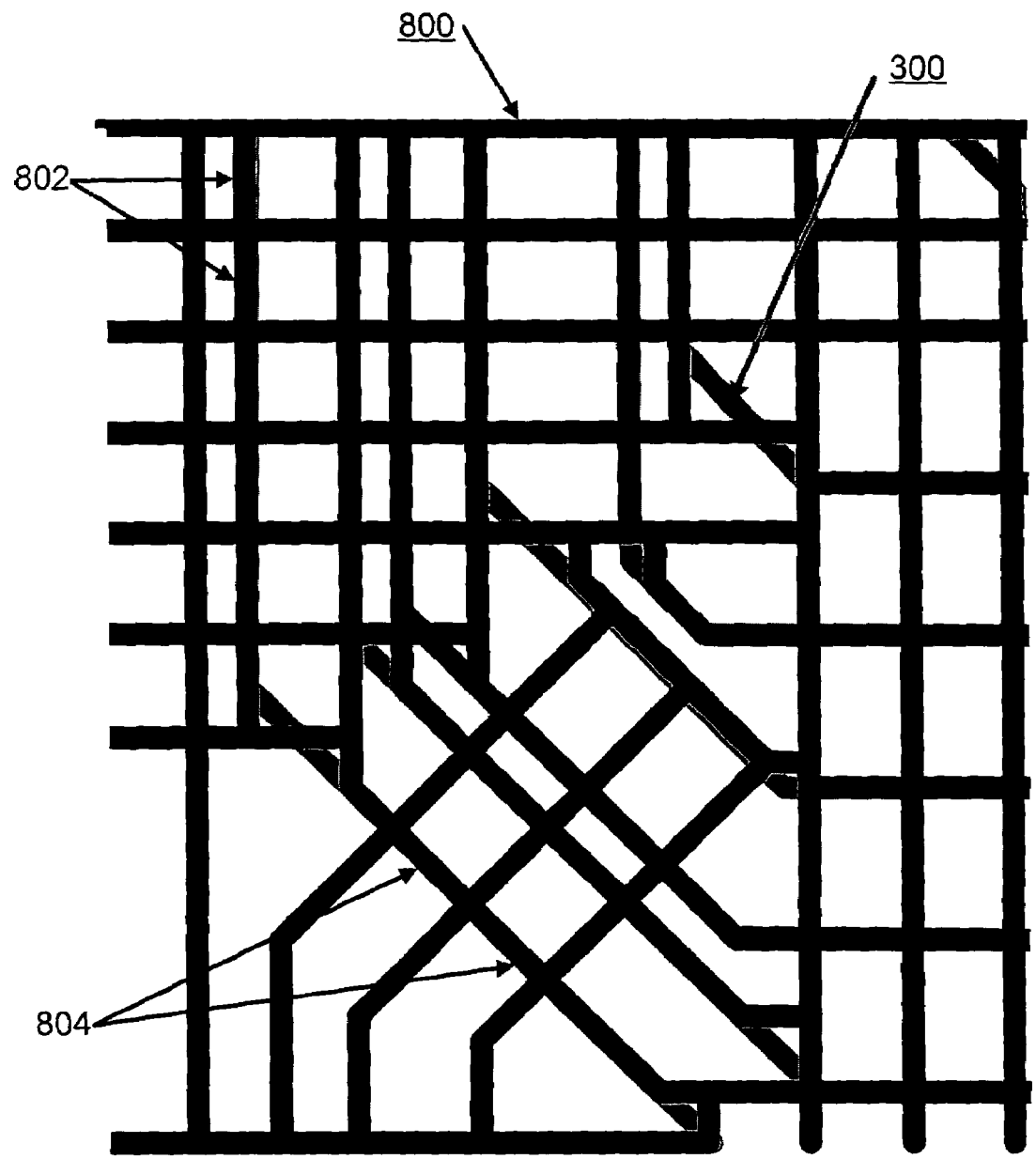

Referring now to FIG. 8, there is shown an exemplary customized mesh plane generally designated by reference character 800 in accordance a shifted fill method of the preferred embodiment. Customized mesh plane 800 includes shifted mesh structure generally designated by reference character 802 and rotated mesh structure generally designated by reference character 804 filling selected mesh plane holes adjacent to identified signal traces 302 and 304.

Figure 9:
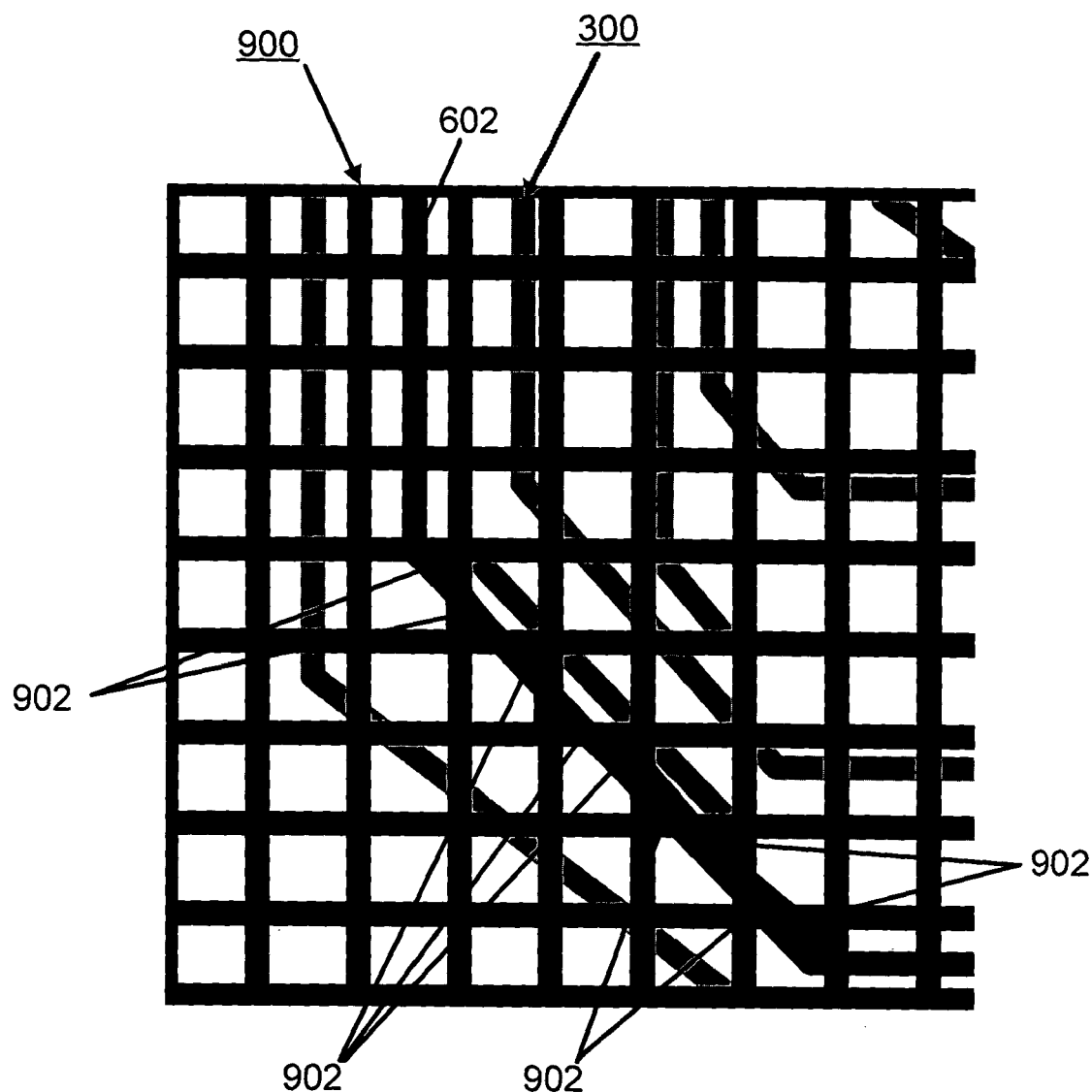

Referring now to FIG. 9, there is shown an exemplary customized mesh plane generally designated by reference character 900 in accordance a corner fill method and the single line fill method of the preferred embodiment. Customized mesh plane 900 includes a corner fill structure 902 filling selected mesh plane holes adjacent to identified signal trace 304 and the single line structure 602 added to the mesh plane 400 of FIG. 4 filling selected mesh plane holes adjacent to one identified signal trace 302.

Figure 10:
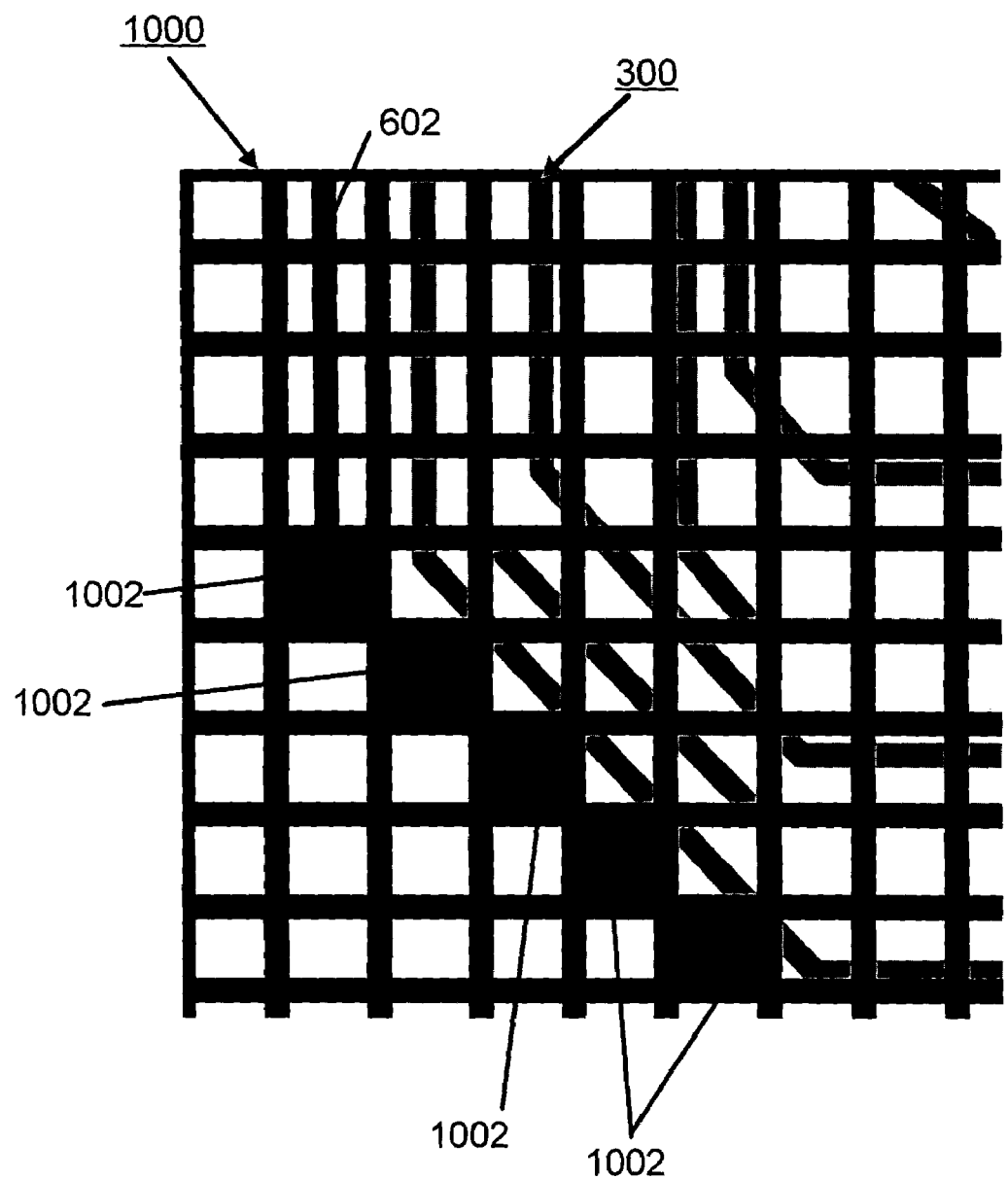

Referring now to FIG. 10, there is shown an exemplary customized mesh plane generally designated by reference character 1000 in accordance a complete fill method and the single line fill method of the preferred embodiment. Customized mesh plane 1000 includes a complete fill structure 1002 filling selected mesh plane holes adjacent to one identified signal trace 304 and the single line structure 602 added to the mesh plane 400 of FIG. 4 filling selected mesh plane holes adjacent to one identified signal trace 302.

Figure 11:
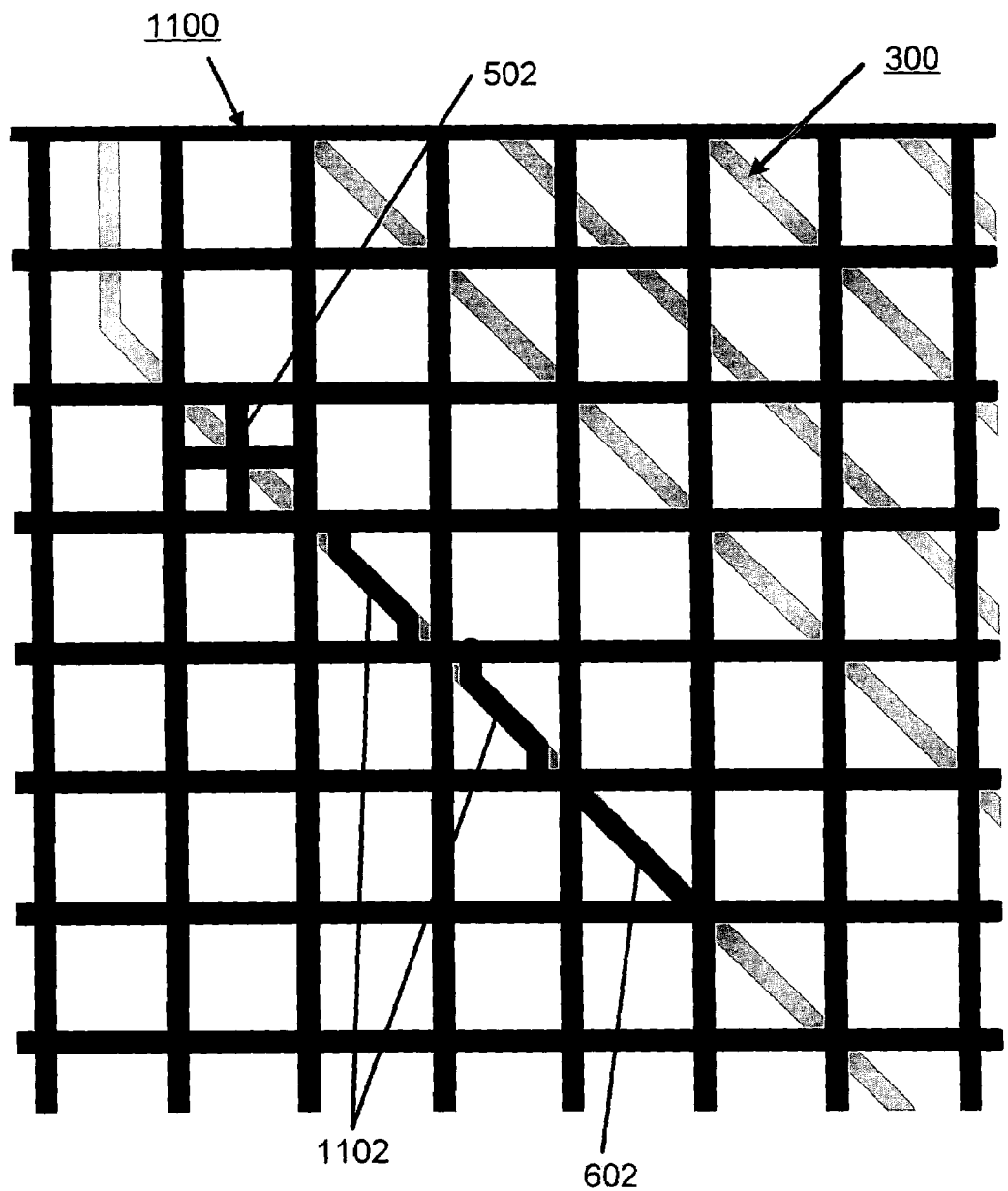

Referring now to FIG. 11, there is shown an exemplary customized mesh plane generally designated by reference character 1100 in accordance an alternative shape fill method and the crosshair and single line fill methods of the preferred embodiment. Customized mesh plane 1100 includes an alternative shaped fill structure 1102 and the single line structure 602 filling selected mesh plane holes adjacent to one identified signal trace 304 and the crosshair structure 502 added to the mesh plane 400 of FIG. 4 filling selected mesh plane holes adjacent to one identified signal trace 302.

Figure 12:
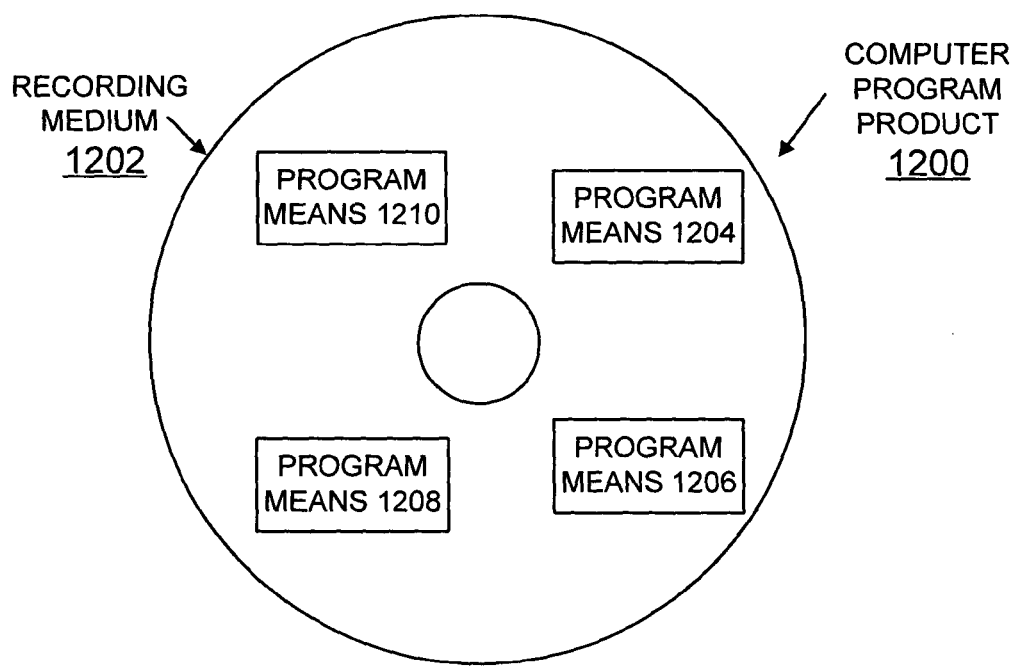
FIG. 12 is a block diagram illustrating a computer program product in accordance with the preferred embodiment.

Referring now to FIG. 12, an article of manufacture or a computer program product 1200 of the invention is illustrated. The computer program product 1200 includes a recording medium 1202, such as, a floppy disk, a high capacity read only memory in the form of an optically read compact disk or CD-ROM, a tape, a transmission type media such as a digital or analog communications link, or a similar computer program product. Recording medium 1202 stores program means 1204, 1206, 1208, 1210 on the medium 1202 for carrying out the methods for creating customized mesh planes within electronic packages of the preferred embodiment in the computer system 100 of FIGS. 1A and 1B.

A sequence of program instructions or a logical assembly of one or more interrelated modules defined by the recorded program means 1204, 1206, 1208, 1210, direct the computer system 100 for creating customized mesh planes of the preferred embodiment.

While the present invention has been described with reference to the details of the embodiments of the invention shown in the drawing, these details are not intended to limit the scope of the invention as claimed in the appended claims.

What is claimed is:

1. A method for creating customized mesh planes in electronic packages comprising the steps of:
   receiving electronic package physical design data;
   comparing signal traces in each adjacent plane to a mesh plane with a mesh layout of the mesh plane;
   identifying signal traces in each adjacent plane to the mesh plane adjacent to mesh holes in the mesh layout of the mesh plane;
   selecting a fill method to replace selected mesh holes with added mesh structure of the mesh plane aligned with the identified signal traces in each adjacent plane to the mesh plane, and wherein the step of selecting said fill method includes the steps of providing a plurality of fill methods, said fill methods including selected ones of a crosshair fill method, a single line fill method, a signal mirror fill method, a mesh shifting fill method, a corner fill method, and a complete fill method;
   and selecting one or a combination of said fill methods.

2. A method for creating customized mesh planes as recited in claim 1 wherein the step of selecting said fill method includes selecting a crosshair fill method to replace selected mesh holes with a crosshair mesh structure aligned with the identified signal traces.

3. A method for creating customized mesh planes as recited in claim 1 wherein the step of selecting said fill method includes selecting a single line fill method to replace selected mesh holes with a single line mesh structure aligned with the identified signal traces.

4. A method for creating customized mesh planes as recited in claim 1 wherein the step of selecting said fill method includes selecting a corner fill method to replace selected mesh holes with a corner fill mesh structure aligned with the identified signal traces.

5. A method for creating customized mesh planes as recited in claim 1 wherein the step of selecting said fill method includes selecting a complete fill method to replace selected mesh holes with a complete fill mesh structure aligned with the identified signal traces.

6. A method for creating customized mesh planes as recited in claim 1 wherein the step of selecting said fill method includes selecting a signal mirror fill method to replace selected mesh holes with a signal mirror mesh structure substantially aligned with all of the signal traces.

7. A method for creating customized mesh planes as recited in claim 1 wherein the step of selecting said fill method includes selecting a crosshair fill method to replace selected mesh holes with a crosshair mesh structure aligned with the identified signal traces; and a single line fill method to replace other selected mesh holes with a single line mesh structure aligned with the identified signal traces.

8. A customized mesh plane created by comparing signal traces in each adjacent plane to a mesh plane with a mesh layout; and identifying signal traces adjacent to mesh holes in the mesh layout comprising:
   a grid mesh plane defined by a plurality of uniformly spaced apart horizontal mesh traces and a plurality of uniformly spaced apart vertical mesh traces; and
   a selected fill structure added to the mesh plane replacing selected mesh holes adjacent to the identified signal traces.

9. A customized mesh plane as recited in claim 8 wherein said selected fill structure includes at least one of a crosshair mesh structure, a single line mesh structure, a signal mirror mesh structure, a mesh shifting mesh structure, a corner mesh structure, and a complete mesh structure.

10. A computer program product for creating customized mesh planes in electronic packages in a computer system, said computer program product including instructions executed by the computer system to cause the computer system to perform the steps of:
    receiving electronic package physical design data;
    comparing signal traces in each adjacent plane to a mesh plane with the mesh layout;
    identifying signal traces in each adjacent plane to the mesh plane adjacent to mesh holes in the mesh layout of the mesh plane;
    selecting a fill method to replace selected mesh holes with added mesh structure of the mesh plane aligned with the identified signal traces in each adjacent plane to the mesh plane, and wherein the step of selecting said fill method includes the steps of providing a plurality of fill methods, said fill methods including selected ones of a crosshair fill method, a single line fill method, a signal mirror fill method, a mesh shifting fill method, a corner fill method, and a complete fill method;
    and selecting one or a combination of said fill methods.

11. A computer program product for creating customized mesh planes as recited in claim 10 wherein the step of selecting said fill method includes the steps of selecting one or a combination of said stored fill methods.

12. A computer program product for creating customized mesh planes as recited in claim 10 wherein the step of selecting said fill method includes the steps of storing manufacturing design rules, and selecting said fill method responsive to said stored manufacturing design rules.

* * * * *